United States Patent
Wong et al.

(10) Patent No.: US 7,859,044 B2
(45) Date of Patent: Dec. 28, 2010

(54) PARTIALLY GATED FINFET WITH GATE DIELECTRIC ON ONLY ONE SIDEWALL

(75) Inventors: Robert C. Wong, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 11/782,079

(22) Filed: Jul. 24, 2007

(65) Prior Publication Data

US 2009/0026523 A1 Jan. 29, 2009

(51) Int. Cl.
*H01L 29/78* (2006.01)
*H01L 27/12* (2006.01)

(52) U.S. Cl. .............. 257/316; 257/315; 257/347; 257/E29.264; 257/E21.421; 438/257

(58) Field of Classification Search .......... 257/315, 257/316, 347
See application file for complete search history.

(56) References Cited

U.S. PATENT DOCUMENTS

| | | | | |
|---|---|---|---|---|
| 5,051,951 A | * | 9/1991 | Maly et al. | 365/185.07 |
| 7,037,790 B2 | | 5/2006 | Chang et al. | |
| 2004/0036118 A1 | * | 2/2004 | Abadeer et al. | 257/347 |
| 2004/0222477 A1 | | 11/2004 | Aller et al. | |
| 2004/0235300 A1 | * | 11/2004 | Mathew et al. | 438/689 |
| 2007/0138599 A1 | * | 6/2007 | Ahn et al. | 257/618 |
| 2007/0183185 A1 | * | 8/2007 | Guo et al. | 365/156 |
| 2007/0210355 A1 | | 9/2007 | Izumida | |
| 2009/0108351 A1 | * | 4/2009 | Yang et al. | 257/347 |

OTHER PUBLICATIONS

Yang, Jeong-Hwan, et al., "Fully Working 1.25um2 6T-SRAM Cell with 45nm Gate Length Triple Gate Transistors", IEDM Tech. Dig., 2003, pp. 23-26.

Kuo et al., "A Capacitorless Double Gate DRAM Technology for Sub-100-nm Embedded and Stand-Alone Memory Applications", IEEE Transactions on Electron Devices, Dec. 2003, pp. 2408-2416, vol. 50, No. 12.

(Continued)

*Primary Examiner*—Marcos D Pizarro
*Assistant Examiner*—Raj Gupta
(74) *Attorney, Agent, or Firm*—Scully, Scott, Murphy & Presser, P.C.; Joseph P. Abate, Esq.

(57) ABSTRACT

A gate dielectric and a gate conductor layer are formed on sidewalls of at least one semiconductor fin. The gate conductor layer is patterned so that a gate electrode is formed on a first sidewall of a portion of the semiconductor fin, while a second sidewall on the opposite side of the first sidewall is not controlled by the gate electrode. A partially gated finFET, that is, a finFET with a gate electrode on the first sidewall and without a gate electrode on the second sidewall is thus formed. Conventional dual gate finFETs may be formed with the inventive partially gated finFETs on the same substrate to provide multiple finFETs having different on-current in the same circuit such as an SRAM circuit.

6 Claims, 11 Drawing Sheets

OTHER PUBLICATIONS

Nagoga et al., "Retention Characteristics of Zero-capacitor RAM (Z-RAM) cell based on FinFET and Tri-Gate devices", 2005 IEEE International SO1 Conference, pp. 203-204.

Ohsawa et al., "Design of a 128-Mb SO1 DRAM Using the Floating Body Cell (FBC)", IEEE Journal of Solid-State Circuits, Jan. 2006, pp. 135-145, vol. 41, No. 1.

Ohsawa et al., "Memory Design Using a One-Transistor Gain Cell on SOI", IEEE Journal of Solid-State Circuits, Nov. 2002, pp. 1510-1522, vol. 37, No. 11.

Shino et al., "Fully-Depleted FBC (Floating Body Cell) with Enlarged Signal Window and Excellent Logic Process Compatibility", International Electron Device Meeting, 2004, pp. 281-284.

* cited by examiner

US 7,859,044 B2

PARTIALLY GATED FINFET WITH GATE DIELECTRIC ON ONLY ONE SIDEWALL

FIELD OF THE INVENTION

The present invention relates to semiconductor devices, and particularly, to partially gated finFETs and methods of manufacturing the same.

BACKGROUND OF THE INVENTION

A FinFET is a metal oxide semiconductor field effect transistor (MOSFET) formed on a semiconductor fin. A gate electrode is placed on at least two sides of a fin or is wrapped around the fin of the finFET. A channel is formed beneath the portion of the surfaces of the semiconductor fin under the gate electrode. A gate dielectric separates the gate electrode and the channel of the finFET. A double gate finFET employs a double gate configuration in which the gate electrode is placed on two opposite sides of the channel. In a triple gate finFET, the gate electrode is placed on one more side of a typically rectangular channel of the transistor. In a quadruple gate finFET or a wrapped gate finFET, the gate electrode is placed on four sides of the channel.

A gate electrode located on at least two sides of the channel of the transistor is a common feature of finFETs known in the art. The increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device has faster switching times, equivalent or higher current density, and much improved short channel control than the mainstream CMOS technology utilizing similar critical dimensions.

In a typical finFET structure, at least one horizontal channel on a sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit area of semiconductor area used for the finFET structure. In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of the short channel effect.

In a typical double gate finFET, a gate dielectric layer and a gate conductor are located upon each of the two semiconductor fin sidewalls facing each other. A spacer material of substantial thickness is located between the top surface of the fin and the top portion of an inverted U-shaped gate electrode such that the top surface of the fin is not controlled directly by the portion of the gate electrode above it. In a typical triple gate finFET, a gate electrode of an inverted U shape is typically located upon the two semiconductor fin sidewalls and also upon the top surface of the fin structure. The top surface of the fin is separated from the top portion of the gate electrode only by a gate dielectric layer and is thus controlled by the gate electrode. In a quadruple gate finFET, a gate electrode surrounds a semiconductor fin having two sidewall surfaces, a top surface, and a bottom surface. Ion implantations are performed on the source and drain regions, which are the end portions of the semiconductor fin, to deliver halo, extension, and source/drain doping while using the gate electrode or other masking layer as a mask.

While providing improved MOSFET performance, the finFETs, however, pose unique design challenges. While planar MOSFET devices have virtually no limit on the width of the device as long as the width is above the lithographical minimum dimension, and therefore, the size of planar MOSFETs may be adjusted arbitrarily, typical finFETs have identical vertical height for the fins. While multiple finFETs may be wired in parallel to provide a transistor having a larger on-current, such transistors having a larger on-current can provide only integer multiples of a unit on-current of a discrete finFET. In other words, for the control of the on-current and the off-current of transistors, planar MOSFETs provide two continuously scalable parameters, which are the width, W and the length, L of the channel but finFETs provide only one continuously scalable parameter, which is the length, L of the finFET, since the height of the fin, and consequently the width of the channel is fixed for all finFETs. Therefore, for a given transistor length, L, which defines the ratio of the on-current to off-current, the amount of on-current from an individual fin is fixed. Use of multiple fins for a finFET may provide an on-current that is an integer multiple of the unit on-current, but non-integer fractions or non-integer multiples of the on-current of the unit on-current requires non-obvious or elaborate processing schemes and/or structures. Also, use of multiple fins tends to use more silicon surface area and makes the device design less area-efficient.

However, transistors with different on-currents are often required in the design of high performance integrated circuits. One such example is a six-transistor SRAM cell, wherein the beta ratio (the ratio of the on-current of a pull-down NFET to the on-current of a pass gate NFET) needs to be kept close to 2 for optimal performance of the SRAM cell.

Referring to FIG. 1, a layout of an exemplary prior art SRAM structure employing planar transistors is shown, which comprises a first pull-up p-type field effect transistor (PFET) 110, a second pull-up PFET 111, two pull-down n-type field effect transistors (NFETs) (120, 121), and two pass gate NFETs (130, 131). Each of the transistors (110, 111, 120, 121, 130, 131) comprises a portion of an active semiconductor area 103 and a portion of gate electrodes 104. The drains of one of the two pull-down NFETs (120, 121) and one of the first pull-up PFET 110 and the second pull-up PFET 111 are connected by M1 level metal lines 105. Of particular interest are the different widths of the active areas of the two pull-down NFETs (120, 121) and two pass gate NFETs (130, 131). It is necessary to maintain the ratio of on-currents between the two pull-down NFETs (120, 121) and two pass gate NFETs (130, 131) to a number close to 2 to maintain stability of an SRAM cell, hence the two different widths between the two types of NFETs.

Referring to FIG. 2, a circuit schematic for an exemplary prior art SRAM comprises a first pull-up PFET 306, a second pull-up PFET 306', a first pull-down NFET 304, a second pull-down NFET 304', a first pass gate NFET 302, and a second pass gate NFET 302'. The electrical connection between a first source/drain of the first pass gate NFET 302 and a first drain of the first pull-down NFET 304 is shown by a node 311, and the electrical connection between a second source/drain of the second pass gate NFET 302' and a second drain of the second pull-down NFET 304' is shown by a node 311'. The electrical connection between the drains of the first pull-up PFET 306 and the first pull-down NFET 304 and the gates of the second pull-up PFET 306' and the second pull-down NFET 304' is schematically shown by a line connecting them and nodes (313A, 313B) at the ends thereof. The electrical connection between the drains of the second pull-up PFET 306' and the second pull-down NFET 304' and the gates of the first pull-up PFET 306 and the first pull-down NFET 304 is schematically shown by a line connecting them and nodes (313A', 313B') at the ends thereof. Bit line wiring (315, 315') is connected to the unwired source/drain of each of the pass gate NFETs (302, 303'). Word line wiring (317, 317') is connected to each of the gates of the pass gate NFETs (302, 303'). The sources of the pull-up PFETs (306, 306') are connected to a power supply wiring 39 and the sources of the pull-down NFETs (304, 304') are connected to ground.

Design of an SRAM circuit employing finFET devices faces challenges due to the need to maintain the ratio of on-currents between pull-down NFETs and pass gate NFETs. Yang et al., "Fully Working 1.25 mm² 6T-SRAM cell with 45 nm gate length Triple Gate Transistors," IEDM Tech. Dig., 2003, pp. 23-26 discloses an SRAM cell design in which a length of pass gate n-type finFET devices is drawn at a longer length of 100 nm to reduce the on-current of a finFET, while other finFET devices are drawn at a shorter length of 80 nm. By increasing the channel length of pass gate NFETs, the ratio of on-currents between the pull-down NFETs and the pass gate NFETs may be kept close to 2 and achieve SRAM cell stability.

Referring to FIG. 3A, a layout for an exemplary prior art SRAM structure employing finFETs is shown up to the M1 level. The layout for the exemplary prior art SRAM structure employing finFETs comprises a first pull-up p-type finFET 210, a second pull-up p-type finFET 211, two pull-down n-type finFETs (220, 221), and two pass gate n-type finFETs (230, 231). Each of the pull-up p-type finFETs and pull-down n-type finFETs (210, 211, 220, 221) comprises a portion of an active semiconductor area 216 and a portion of first gate electrodes 204 having a first width. Each of the pass gate n-type finFETs (230, 231) comprises a portion of an active semiconductor area 216 and a portion of second gate electrodes 204' having a second width. The second width is greater than the first width, and is selected so that the ratio of on-currents between the pull-down n-type finFETs (220, 221) and the pass gate n-type finFETs (230, 231) is close to 2. The drains of one of the two pull-down NFETs (220, 221) and one of the first pull-up PFET 210 and the second pull-up PFET 211 are connected by M1 level metal lines 205.

Referring to FIGS. 3B and 3C, vertical cross-sectional views of a physical exemplary prior art SRAM structure based on the layout of FIG. 3A are shown. FIG. 3B and FIG. 3C are vertical cross-sectional views of the physical exemplary prior art SRAM structure based on the layout of FIG. 3A corresponding to a plane along the plane B-B' and along the plant C-C', respectively. The physical exemplary prior art SRAM structure comprises a semiconductor substrate 308 containing a handle substrate 301 and a buried insulator layer 302. Semiconductor fins 303 and gate caps 316 are formed in areas corresponding to the active semiconductor area 216 of the exemplary layout in FIG. 3A. A gate dielectric 315 is formed on two sidewalls of each of the semiconductor fins 303. A first physical gate electrode 304 corresponding to the first gate electrodes of the exemplary layout in FIG. 3A is formed on a physical pull-down n-type finFET, and a second physical gate electrode 304' corresponding to the second gate electrodes of the exemplary layout in FIG. 3A is formed on a physical pass gate n-type finFET. The first physical gate electrode 30 and the second physical gate electrode 304' contact both sidewalls of the semiconductor fins 303. The ratio of the on-currents of the n-type finFETs is controlled by the widths of the first physical gate electrode 30 and the second physical gate electrode 304' in the direction perpendicular to the cross-sectional views.

While the prior art provides a method of providing SRAM cell stability by employing different channel lengths for various n-type finFETs, the use of the longer channel length not only consumes more silicon substrate area, but also introduces variables in terms of the variability of the physical dimensions of the gate lengths due to process variations and the complexities of optical proximity correction. For example, while the differences in dimension may be 20 nm between the longer length and the shorter length in a design layout, the differences in the physical dimension, which determines the actual device performance, is prone to process variations and optical proximity effect, i.e., the variability of actual dimensions due to adjacent physical structures in the layout. In addition, different gate lengths give different short channel effect, which can cause threshold voltage mismatching or ratio variation induced by Vdd variation.

Alternative approaches for providing multiple finFETs having different on-currents have also been proposed. For example, Aller et al., in U.S. Patent Application Publication No. 2004/0222477 A1 discloses a finFET device provided with a first semiconductor fin and a second semiconductor fin with different heights and adjustments on the ratio of the height of the first semiconductor fin to that of the second semiconductor fin are used to tune the performance of the transistor. However, the use of a thermal oxidation process to reduce the height of the fin requires that a hardmask be used in this process. Many processing steps are necessary such as deposition of a hardmask material, application and lithographic patterning of a photoresist, a transfer of a lithographic pattern into the hardmask, and thermal oxidation. The oxidation raises surface level due to volume expansion caused by the oxidation, which causes vertical variation in the height of the substrate which reduces usable depth of focus during subsequent lithographic process and may cause critical dimension (CD) variations in the printed lithographic images. Other prior art structures that provide multiple fin heights involve additional processes to enable multiple fin heights.

Therefore, there exists a need for a semiconductor structure having multiple finFET devices on the same semiconductor substrate, wherein the multiple finFET devices have the same fin height and different on-currents, and methods of manufacturing the same. Such structures may be advantageously employed in semiconductor circuits that require devices with different levels of on-currents.

SUMMARY OF THE INVENTION

The present invention addresses the needs described above by provides partially gated finFET devices, i.e., finFET devices having a gate electrode only on one of the sidewalls of a semiconductor fin, and methods of manufacturing the same.

According to the present invention, at least one semiconductor fin is formed on a substrate. A gate dielectric and a gate conductor layer are formed on sidewalls of the at least one semiconductor fine. The gate conductor layer is patterned so that a gate electrode is formed on a first sidewall of a portion of the semiconductor fin, while a second sidewall on the opposite side of the first sidewall is not controlled by the gate electrode. A finFET with a gate electrode on the first sidewall and without a gate electrode on the second sidewall is formed. This may be affected by removing the material of the gate conductor layer from above the surface of the second sidewall or by electrically disconnecting the portion of the gate electrode material from the gate electrode over the first sidewall.

The inventive structure may be formed by first patterning gate lines followed by use of a gate cut mask, or may be formed by deposition of the gate conductor layer over at least one fin cap followed by removal of the portion of the gate conductor layer over the at least one fin cap. Conventional dual gate finFETs may be formed with the inventive partially gated finFETs on the same substrate to provide multiple finFETs having different on-current in the same circuit such as an SRAM circuit.

According to an aspect of the present invention, a semiconductor structure is provided, which comprises:
 a semiconductor fin located on a substrate;
 a gate dielectric portion abutting a sidewall of the semiconductor fin; and
 a gate electrode abutting the gate dielectric portion and substantially electrically disconnected from another sidewall of the semiconductor fin, wherein the another sidewall is located on the opposite side of the sidewall.

In one embodiment, the semiconductor structure may further comprise:
 another gate dielectric portion abutting the another sidewall of the semiconductor fin; and
 a middle-of-line (MOL) dielectric abutting the entirety of the another gate dielectric portion.

In another embodiment, the semiconductor structure may further comprise a middle-of-line (MOL) dielectric abutting the entirety of the another sidewall.

In still another embodiment, the semiconductor structure may further comprise:
 another gate dielectric portion abutting the another sidewall of the semiconductor fin; and
 a conductive block abutting the another gate dielectric portion and electrically floating.

The conductive block and the gate electrode comprise the same material.

In a further embodiment, the semiconductor structure may further comprise a fin cap comprising a dielectric material and having a first fin cap sidewall and a second fin cap sidewall, wherein the first fin cap sidewall abuts the gate electrode and the second fin cap sidewall does not abut the gate electrode.

According to another aspect of the present invention, another semiconductor structure is provided, which comprises:
 a dual gate finFET containing:
  a first semiconductor fin portion located on a substrate;
  a first gate dielectric portion abutting a first sidewall of the first semiconductor fin portion;
  a second gate dielectric portion abutting a second sidewall of the first semiconductor fin portion, wherein the second sidewall is located on the opposite side of the first sidewall; and
  a first gate electrode abutting the first gate dielectric portion and the second gate dielectric portion; and
 a partially gated finFET containing:
  a second semiconductor fin portion located on the substrate;
  a third gate dielectric portion abutting a third sidewall of the second semiconductor fin portion; and
  a second gate electrode abutting the third gate dielectric portion and substantially electrically decoupled from a fourth sidewall of the second semiconductor fin portion, wherein the fourth sidewall is located on the opposite side of the third sidewall.

In one embodiment, the semiconductor structure further comprises:
 a fourth gate dielectric portion abutting the fourth sidewall of the second semiconductor fin portion; and
 a middle-of-line (MOL) dielectric abutting the entirety of the fourth gate dielectric portion.

In another embodiment, the semiconductor structure further comprises a middle-of-line (MOL) dielectric abutting the entirety of the fourth sidewall.

In still another embodiment, the semiconductor structure further comprises:
 a fourth gate dielectric portion abutting the fourth sidewall of the second semiconductor fin portion; and
 a conductive block abutting the fourth gate dielectric portion and electrically floating.

In yet another embodiment, the conductive block and the second gate electrode comprise the same material.

In a further embodiment, the first semiconductor fin portion and the second semiconductor fin portion are located in the same semiconductor fin. The dual gate finFET may be a pull-down n-type finFET and the partially gated finFET may be a pass gate n-type finFET.

In another further embodiment, the semiconductor structure further comprises:
 a fin cap comprising a first dielectric material and located above and vertically abutting the first semiconductor fin portion and the second semiconductor fin portion; and
 at least another fin cap comprising a second dielectric material and vertically abutting the fin cap above the first semiconductor fin portion and not present above the second semiconductor fin portion.

According to a further aspect of the present invention, a method of forming a semiconductor structure is provided, which comprises:
 forming at least one semiconductor fin on a substrate, the at least one semiconductor fin having a first semiconductor fin portion and a second semiconductor fin portion;
 forming a gate dielectric on sidewalls of the at least one semiconductor fin, wherein the gate dielectric contains a first gate dielectric portion and a second gate dielectric portion formed on the first semiconductor fin portion and a third gate dielectric portion and a fourth dielectric portion formed on the second semiconductor fin, the first gate dielectric portion is located on the opposite side of the second gate dielectric portion, and the third gate dielectric portion is located on the opposite side of the fourth gate dielectric portion;
 forming a gate conductor layer on the gate dielectric; and
 patterning the gate conductor layer to form a first gate electrode on the first semiconductor fin portion and a second gate electrode on the second semiconductor fin portion, wherein the first gate electrode abuts the first gate dielectric portion and the second gate dielectric portion and the second gate electrode abuts the third gate dielectric portion and does not abut the fourth gate dielectric portion.

In one embodiment, the method may further comprise forming a middle-of-line (MOL) dielectric abutting the entirety of the fourth gate dielectric portion.

In another embodiment, the method may further comprise:
 a. removing the fourth gate dielectric portion; and
 b. forming a middle-of-line (MOL) dielectric abutting the entirety of the fourth sidewall.

In still another embodiment, the method may further comprise removing a portion of the gate conductor layer from above the second semiconductor fin portion to form a conductive block, wherein the conductive block abuts the fourth gate dielectric portion and is electrically floating.

In yet another embodiment, the conductive block and the second gate electrode may comprise the same material.

In a further embodiment, the method may further comprise:

a. forming a fin cap comprising a first dielectric material directly on the first semiconductor fin portion and the second semiconductor fin portion;

b. forming at least another fin cap comprising a second dielectric material directly on the fin cap above the first semiconductor fin portion and not above the second semiconductor fin portion; and c. removing the portion of the gate conductor layer located above a top surface of the at least another fin cap.

As a specific example of an application of the present invention, two n-type finFETs may be formed on the same semiconductor fin having the same height across the semiconductor fin. A first n-type finFET may be a partially gated finFET and a second n-type finFET may be a dual gate finFET. The on-current of the first n-type finFET is about 50% of the on-current of the second n-type finFET. The first n-type finFET may be employed as a pass gate NFET and the second n-type finFET may be employed as a pull-down NFET by joining the drain of the first n-type finFET and a source/drain of the second n-type finFET.

Similar benefits of the present invention can readily be extended to other circuits that can utilize different amount of on-current for different finFET devices.

BRIEF DESCRIPTION OF THE DRAWINGS

FIG. 3B and FIG. 3C are vertical cross-sectional views of the physical exemplary prior art SRAM structure based on the layout of FIG. 3A corresponding to a plane along the plane B-B' and along the plant C-C', respectively.

FIG. 6D is a view of a variation on the first exemplary SRAM structure in a plane equivalent to C-C' in FIG. 6A.

DETAILED DESCRIPTION OF THE INVENTION

Figure 1:
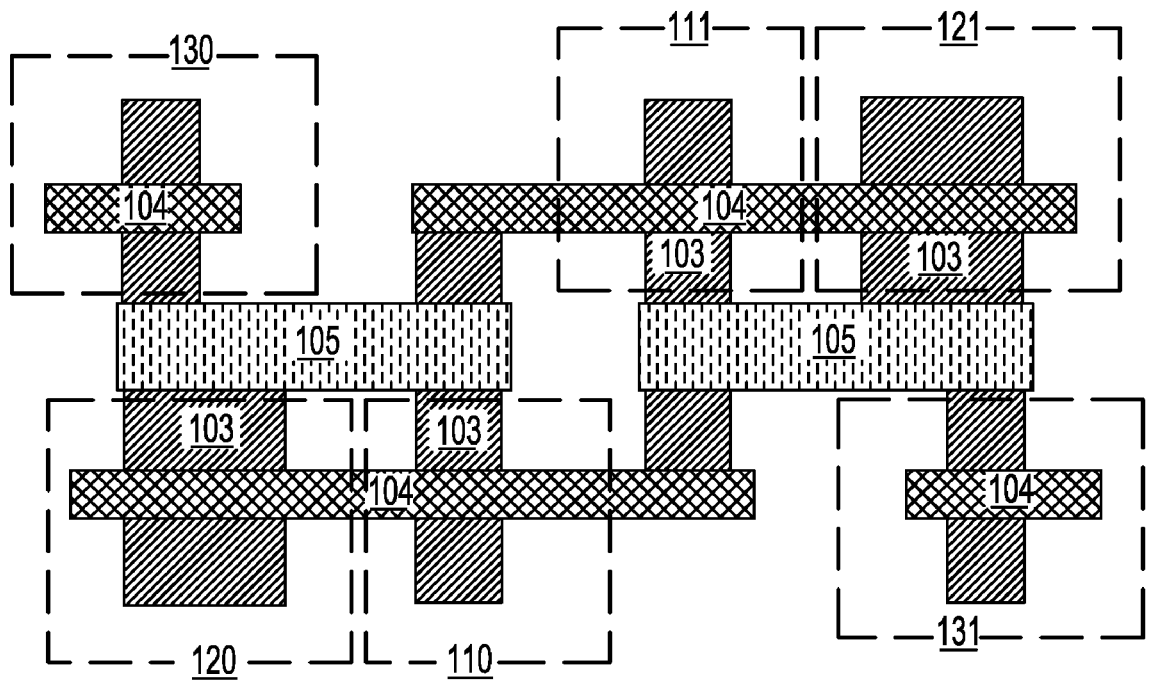
FIG. 1 is a layout of an exemplary prior art SRAM structure employing planar transistors.

As stated above, the present invention relates to partially gated finFETs and methods of manufacturing the same, which are now described in detail with accompanying figures. It is noted that like and corresponding elements are referred to by like reference numerals.

The present invention is described herein with exemplary semiconductor structures containing an SRAM cell. Application of the present invention to general semiconductor circuits containing other types of finFETs is straightforward and explicitly contemplated herein.

Figure 4A:
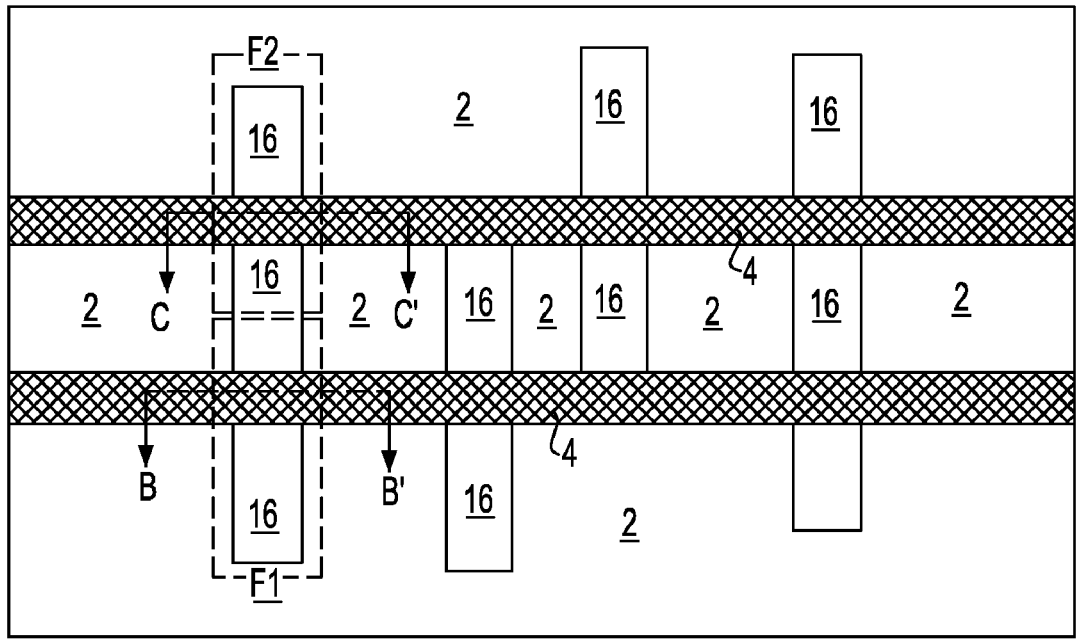
FIGS. 4A-6D are sequential views of a first exemplary SRAM structure employing inventive partially gated finFETs according to a first embodiment of the present invention. Figures with the suffix A are top-down views. Figures with the suffix B are cross-sectional views along the plane B-B' in the top down view with the same figure numeral and the suffix, A. Figures with the suffix C are cross-sectional views along the plane C-C' in the top down view with the same figure numeral and the suffix, A.
Figure 4B:
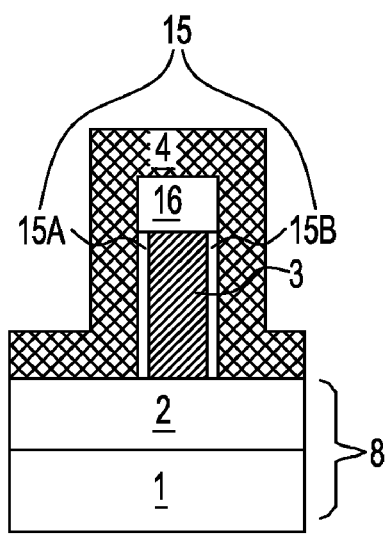
Figure 4C:
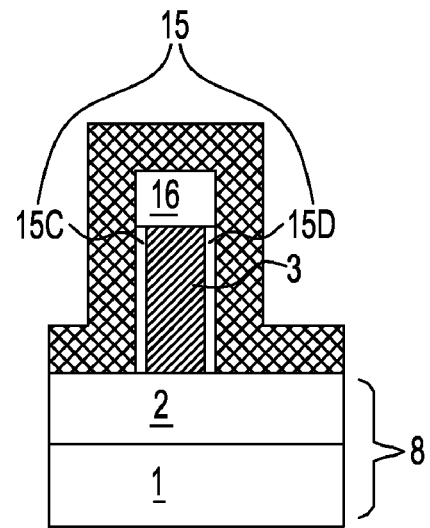

Referring to FIG. 4A-4C, a first exemplary structure according to a first embodiment of the present invention is shown, which comprises a semiconductor substrate 8 containing a handle substrate 1 and a buried insulator layer 2. Semiconductor fins 3 are formed directly on the buried insulator layer 2.

The semiconductor fins 3 may be formed by employing a semiconductor-on-insulator (SOI) substrate and patterning a top semiconductor layer (not shown) into the semiconductor fins 3. For example, a fin cap layer (not shown) comprising a dielectric material such as a nitride or an oxide is formed on the top semiconductor layer and lithographically patterned and etched to form fin caps 16. The top semiconductor layer is etched by a reactive ion etch employing the fin caps 16 as a hardmask. The potion of the top semiconductor layer outside the area covered by the fin caps 16 is removed and the buried insulator layer 2 is exposed. The remaining portion of the top semiconductor layer underneath the fin caps 16 constitutes the semiconductor fins 3.

The height of the semiconductor fins 3 may be substantially the same. The same height for all the semiconductor fins is preferred since no additional processing steps are required to form different fin heights. However, semiconductor fins 3 having different fin heights may be formed as needed by adding additional processing steps. Such variations are explicitly contemplated herein.

The semiconductor fins 3 comprise the same semiconductor material as the top semiconductor layer of the SOI substrate. The semiconductor fins 3 may comprise silicon, germanium, silicon-germanium alloy, silicon-carbon alloy, silicon-germanium-carbon alloy, Ge alloys, GaAs, InAs, InP, other III-V or II-VI compound semiconductors. Preferably, each of the semiconductor fins 3 is a single crystalline and has an insignificant level of crystalline defects.

The present invention may be practiced with a bulk semiconductor substrate (not shown) or a hybrid semiconductor substrate (not shown) as wells as with an SOI substrate. Alternatively, the semiconductor fins 3 may be formed on an insulator substrate (not shown) such as a quartz substrate or an aluminum oxide substrate.

In the description of the present invention, two portions of the semiconductor fins 3 are specifically referred to as a first semiconductor fin portion F1 and a second semiconductor fin portion F2, respectively, of which the areas are shown in dotted rectangles in FIG. 4A. In the first exemplary semiconductor structure, a dual gate n-type finFET is formed in the first semiconductor fin portion F1 and a partially gated n-type finFET is formed in the second semiconductor fin portion F2. The first semiconductor fin portion F1 and the second semiconductor fin portion F2 are located in the same semiconductor fin and abuts each other.

A gate dielectric 15 is formed on the semiconductor fins 3. The gate dielectric 15 may comprise a conventional dielectric material such as silicon oxide, silicon nitride, or silicon oxynitride. The gate dielectric material 15 may alternatively comprise a high-K dielectric layer or a stack a conventional dielectric material and a high-K dielectric layer. The gate dielectric 15 may be formed only on sidewalls of the first semiconductor fins 3, or may be formed on the sidewalls of the semiconductor fins 3 and over other exposed surfaces of the first exemplary structure.

Of the many portions of the gate dielectric 15, the portion on a left sidewall, to be referred to as a first sidewall, of the first semiconductor fin portion F1 is hereafter referred to a first gate dielectric portion 15A. Likewise, the portion on a right sidewall, to be referred to as a second sidewall, of the first semiconductor fin portion F1 is hereafter referred to a second gate dielectric portion 15B. The portion on a left sidewall, to be referred to as a third sidewall, of the second semiconductor fin portion F2 is hereafter referred to a third gate dielectric portion 15C. The portion on a right sidewall, to be referred to as a fourth sidewall, of the second semiconductor fin portion F2 is hereafter referred to a fourth gate dielectric portion 15D. The various sidewalls of the first and second semiconductor fin portions (F1, F2) are substantially vertical.

A gate conductor layer (not shown) is formed on the surfaces of the first exemplary semiconductor structure and lithographically patterned and etched. The etched portions of the gate conductor layer forms gate conductor lines 4, which may run in the direction perpendicular to at least one of the semiconductor fins 3. Specifically, one of the gate conductor lines 4 runs over the first semiconductor fin portion F1 and another of the gate conductor lines 4 runs over the second semiconductor fin portion F2. The gate conductor line 4 over the first semiconductor fin portion F1 is hereafter referred to as a first gate conductor line, and the gate conductor line 4 over the second semiconductor fin portion F2 is hereafter referred to as a second gate conductor line. Preferably, the first gate conductor line and the second gate conductor line has the same width to provide the same gate length to the dual gate n-type finFET to be formed on the first semiconductor fin portion F1 and to the partially gated n-type finFET to be formed on the second semiconductor fin portion F2. The gate conductor lines 4 may comprise a semiconductor material such as doped silicon and/or metallic conductive material as may be employed in metal gate structures.

Figure 5A:
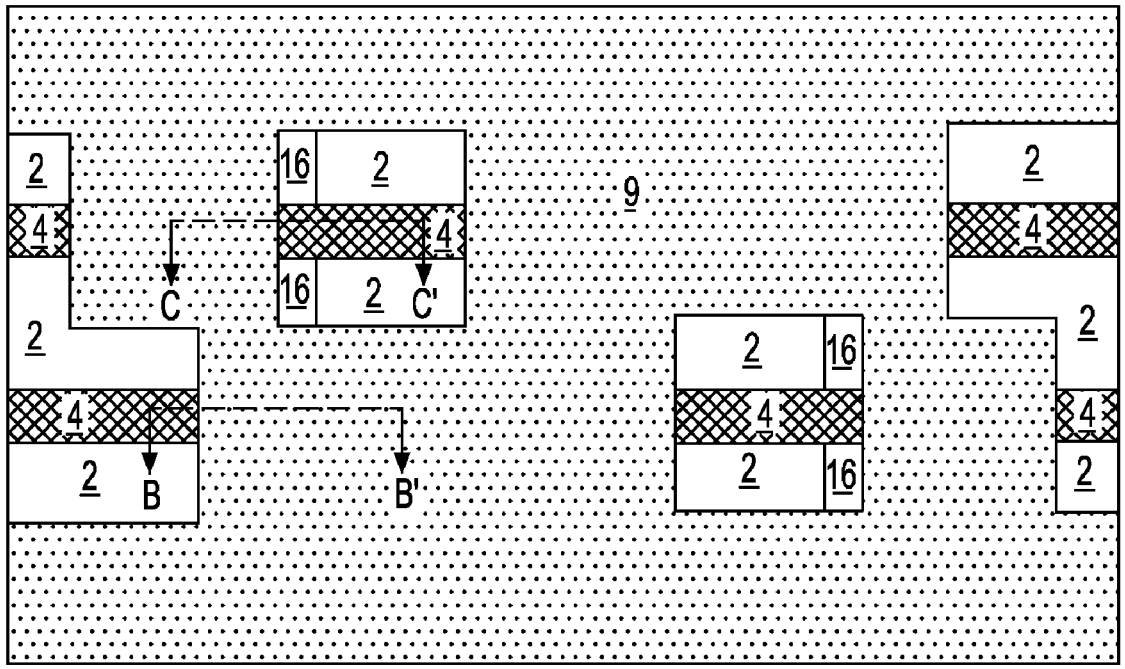
Figure 5B:
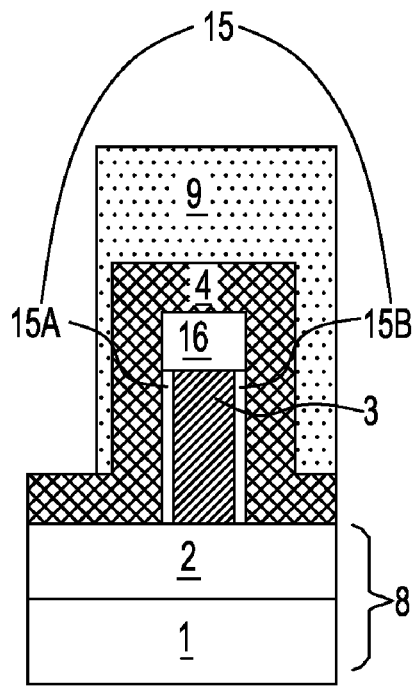
Figure 5C:
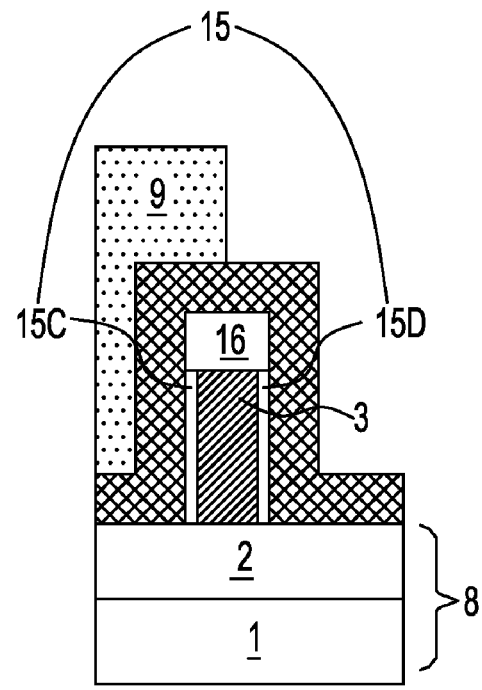

Referring to FIGS. 5A-5C, a photoresist 9 is applied over the exemplary semiconductor structure and lithographically patterned to expose portions of the gate conductor lines 4 that are to be removed. The exposed portions of the gate conductor lines 4 include a portion of the second gate conductor line directly above the second semiconductor fin portion F2 and the portion of the second gate conductor line abutting the fourth gate dielectric portion 15D. However, the portion of the second gate conductor line abutting the third gate dielectric portion 15A is covered by the photoresist 9. Also, the portion of the first gate conductor line directly above the first semiconductor fin portion F1, the portion of the first gate conductor line abutting the first gate dielectric portion 15A, and the portion of the first gate conductor line abutting the second gate dielectric portion 15B are also covered by the photoresist 9. Other portions of the gate conductor lines 4 that need to be disconnected for SRAM circuit wiring are also exposed. In a general semiconductor structure, a portion of a gate conductor line located directly above a semiconductor fin portion and an adjoined portion of the gate conductor line abutting a gate dielectric portion located directly on a sidewall of the semiconductor fin are exposed to enable removal of the gate conductor line from one side of the semiconductor fin portion in a subsequent etch.

Figure 6A:
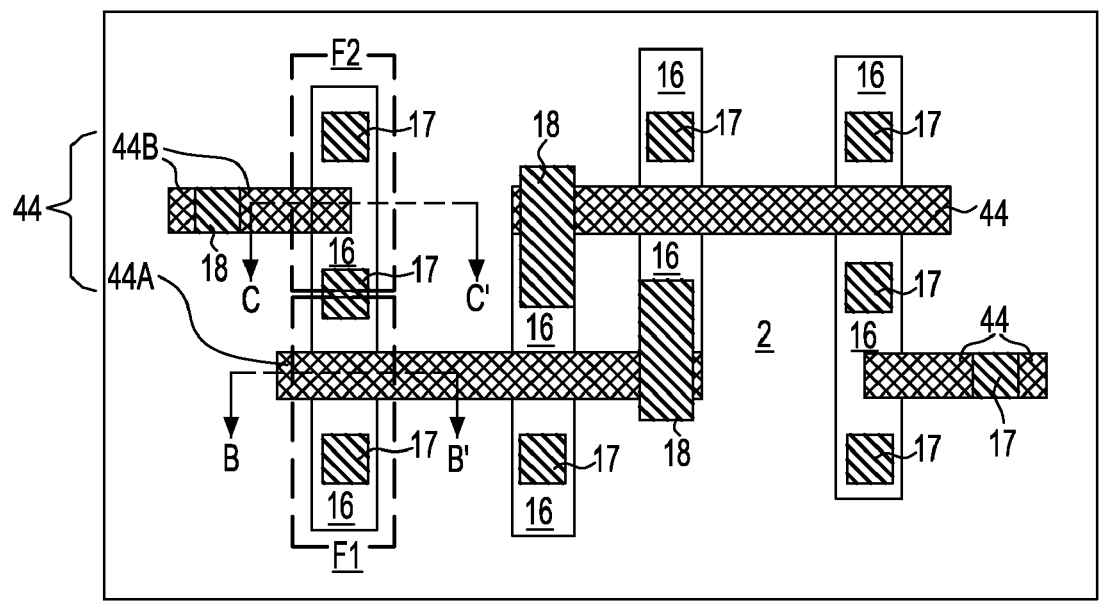
Figures 6B, 6C, 6D:
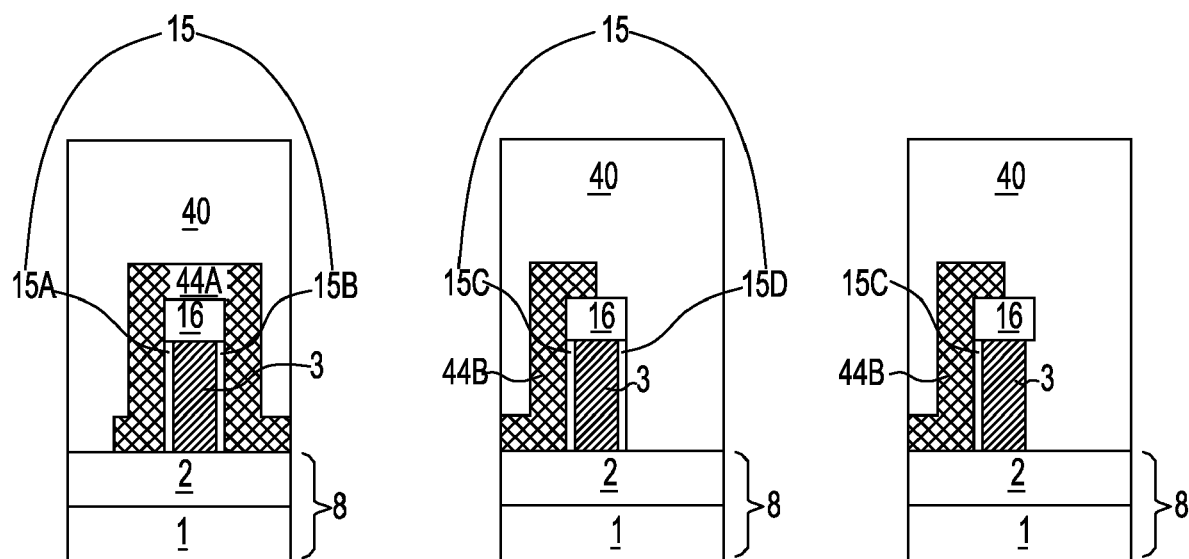

Referring to FIGS. 6A-6C, the exposed portions of the gate conductor lines 4 are etched by a reactive ion etch. The remaining portions of the gate conductor lines 4 constitute gate electrodes 44. Particularly, the gate electrode 44 on the first semiconductor fin portion F1 is hereafter referred to as the first gate electrode 44A. The gate electrode 44 on the second semiconductor fin portion F2 is hereafter referred to as the second gate electrode 44B. The remaining portion of the photoresist 9 is removed, for example, by ashing and the first exemplary semiconductor structure may be cleaned as necessary, for example, by a wet clean.

While the present invention is herein described by a two step formation of the gate electrodes, in which the gate conductor layer is first etched into gate conductor lines 4, followed by another etching in which the gate conductor lines 4 are etched into gate electrodes 44, the gate electrodes 44 may be formed by a one step etch directly from the gate conductor layer if desired. Such variations are explicitly contemplated herein.

Figure 2:
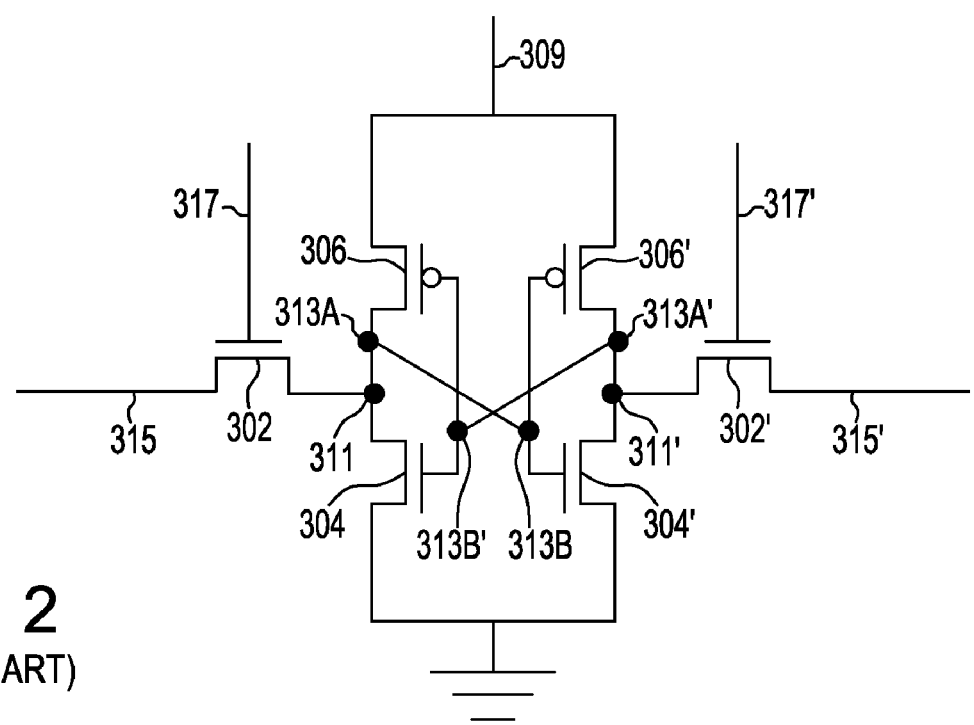
FIG. 2 is a circuit schematic for an exemplary prior art SRAM cell.
Figure 3A:
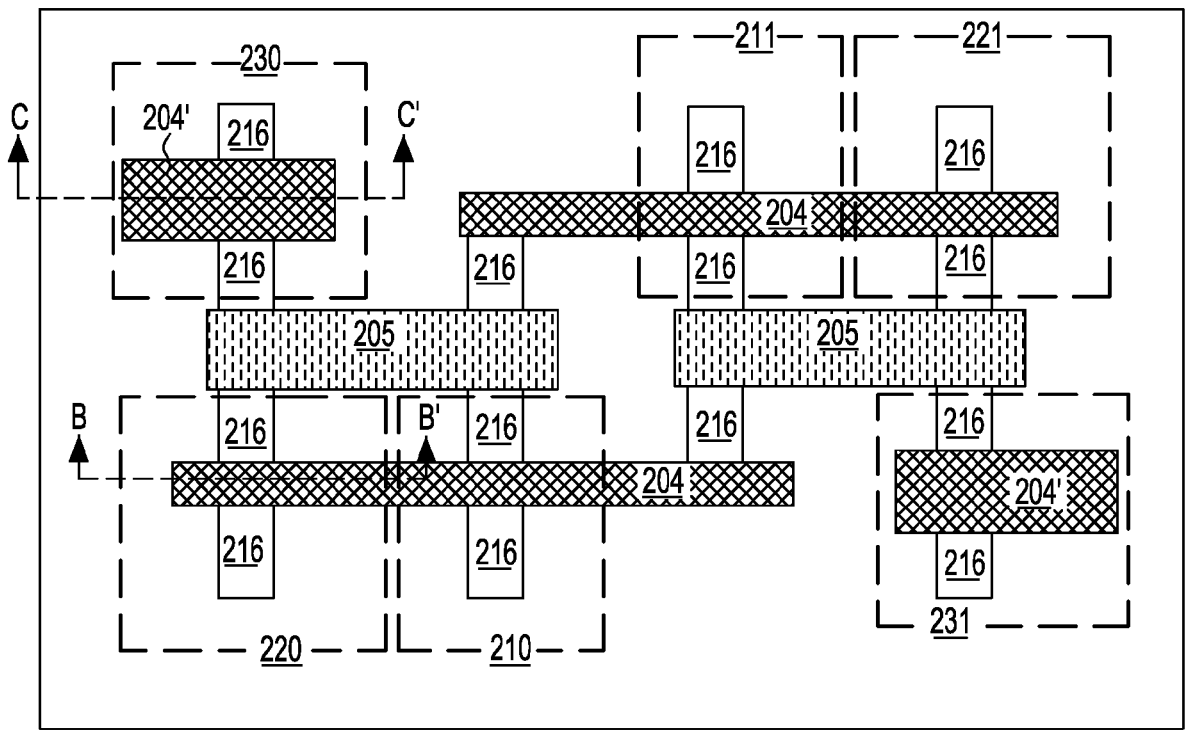
FIG. 3A a layout of an exemplary prior art SRAM structure employing finFETs.
Figure 3B:
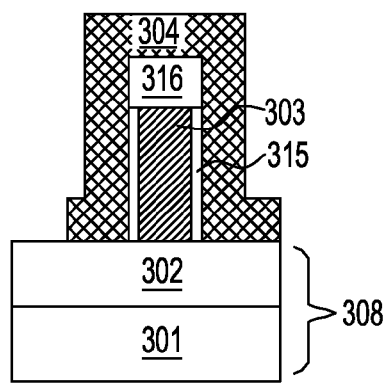
FIGS. 3B and 3C are vertical cross-sectional views of a physical exemplary prior art SRAM structure based on the layout of FIG. 3A.
Figure 3C:
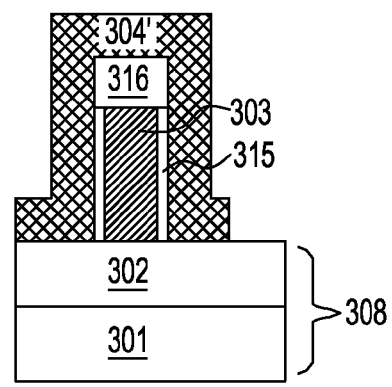

Standard semiconductor processing steps follow such as extension implantations, formation of gate spacers, source and drain implantation, source and drain activation anneals, silicide formation, and optional formation of stress-generating structures such as stress-generating embedded regions and/or stress generating liners. The various processing steps may be performed to form a six finFET SRAM cell having a circuit configuration in FIG. 2.

A middle-of-line (MOL) dielectric 40 is deposited over the surfaces of the first exemplary structure and planarized. The MOL dielectric 40 is not shown in the top-down view of FIG. 6A for clarity but is shown in FIGS. 6B and 6C. The MOL dielectric 40 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Contact via holes and/or contact bar holes are formed in the MOL dielectric 40 and filled with metal to from contact vias 17 and contact bars 18.

At this point, the first exemplary semiconductor comprises a dual gate finFET and a partially gated finFET, in which the dual gate finFET contains:
   i. a first semiconductor fin portion F1 having a first height and located on a substrate;
   ii. a first gate dielectric portion 15A abutting a first sidewall of the first semiconductor fin portion F1;
   iii. a second gate dielectric portion 15B abutting a second sidewall of the first semiconductor fin portion F1, wherein the second sidewall is located on the opposite side of the first sidewall; and
   iv. a first gate electrode 44A abutting the first gate dielectric portion 15A and the second gate dielectric portion 15B.

Further, the partially gated finFET contains:
   i. a second semiconductor fin portion F2 and located on the substrate;
   ii. a third gate dielectric portion 15C abutting a third sidewall of the second semiconductor fin portion F2; and
   iii. a second gate electrode 44B abutting the third gate dielectric portion 15C and substantially electrically decoupled from a fourth sidewall of the second semiconductor fin portion F2, wherein the fourth sidewall is located on the opposite side of the third sidewall.

The first gate electrode 44A abuts a top surface and two sidewalls of the gate cap 16.

Further, the second gate electrode 44B abutting the third gate dielectric portion 15C is substantially electrically decoupled from the fourth sidewall of the second semiconductor fin portion since the second gate electrode 44B does not extend to the fourth sidewall, i.e., does not overlie any portion of the fourth sidewall. The only electrical coupling between the second gate electrode 44B and the fourth sidewall is a capacitive coupling through the second semiconductor fin portion, which is insignificant and is substantially equal to zero, i.e., is inconsequential in the operation of a finFET.

The fourth gate dielectric portion 15D may be present on the fourth sidewall of the second semiconductor fin portion. In this case, the fourth gate dielectric portion 15D abuts the fourth sidewall of the second semiconductor fin portion F2. Also, the middle-of-line (MOL) dielectric 40 abuts the entirety of the fourth gate dielectric portion F2.

Referring to FIG. 6D, a variation of the first exemplary structure is shown along the plane C-C' in FIG. 6A, in which the fourth gate dielectric portion 15D is removed prior to formation of the MOL dielectric 40. In this case, the MOL dielectric 40 abuts the entirety of the fourth sidewall of the second semiconductor fin portion F2.

Figure 7A:
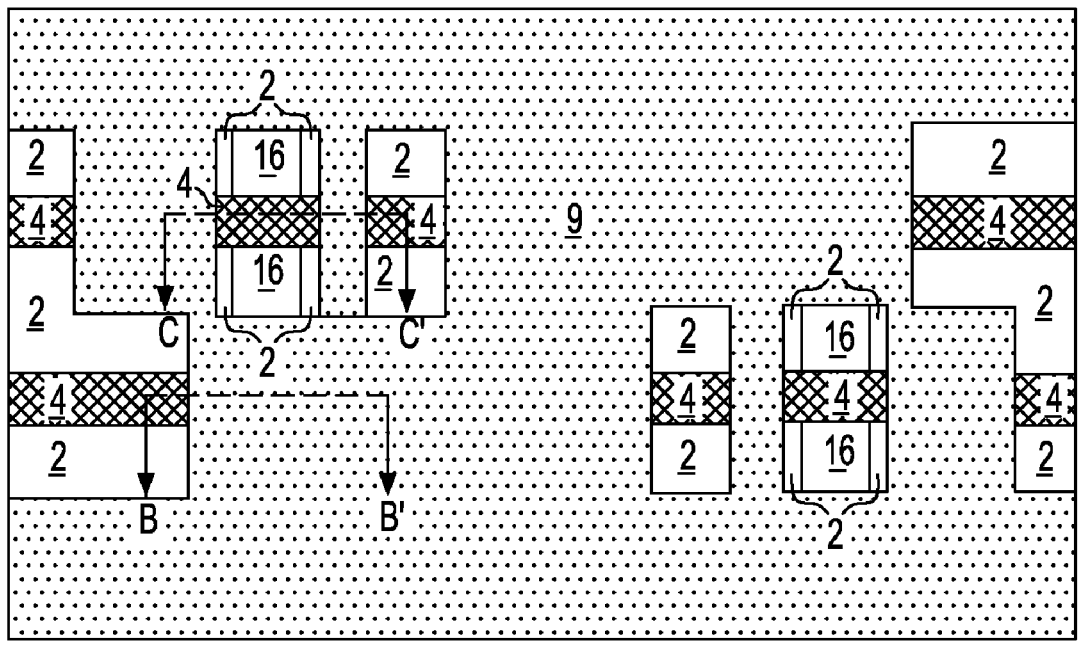
FIGS. 7A-8C are views of a second exemplary SRAM structure employing inventive partially gated finFETs according to a second embodiment of the present invention. Figures with the suffix A are top-down views. Figures with the suffix B are cross-sectional views along the plane B-B' in the top down view with the same figure numeral and the suffix, A. Figures with the suffix C are cross-sectional views along the plane C-C' in the top down view with the same figure numeral and the suffix, A.
Figure 7B:
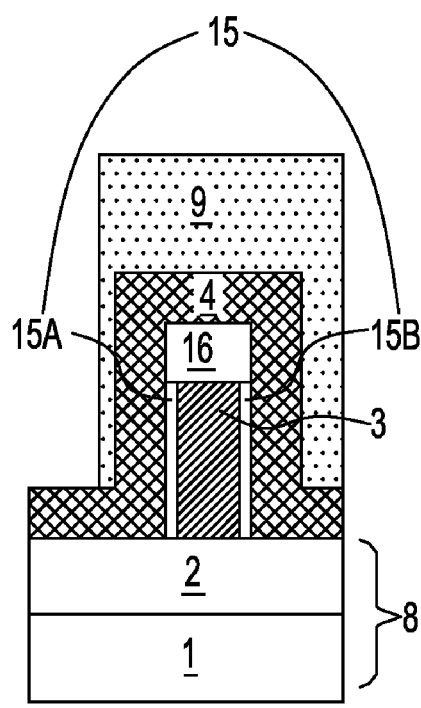
Figure 7C:
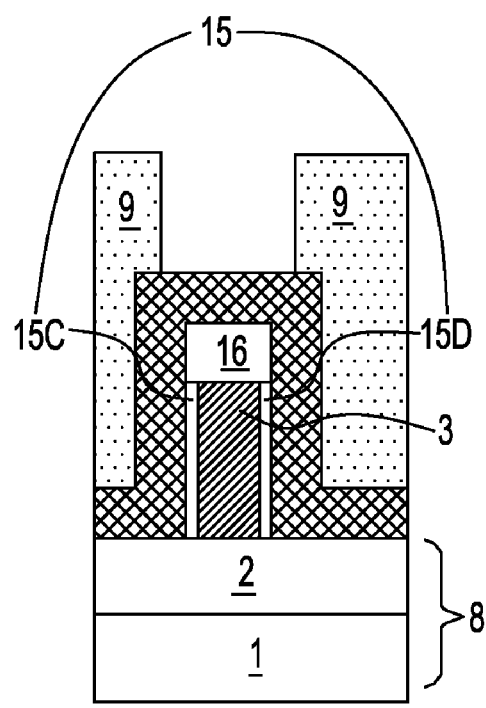

Referring to FIGS. 7A-7C, a second exemplary semiconductor structure according to the present invention is shown, which may be derived from the first exemplary structure shown in FIGS. 4A-4C. A photoresist 9 is applied over the first exemplary semiconductor structure of FIGS. 4A-4C and lithographically patterned to expose portions of the gate conductor lines 4 that are to be removed.

The exposed portions of the gate conductor lines 4 include the entirety of the second gate conductor line that is located directly above the second semiconductor fin portion F2. However, the portion of the second gate conductor line abutting the third gate dielectric portion 15A and the portion of the second gate conductor line abutting the fourth gate dielectric portion 15D are covered by the photoresist 9. Also, the portion of the first gate conductor line directly above the first semiconductor fin portion F1, the portion of the first gate conductor line abutting the first gate dielectric portion 15A, and the portion of the first gate conductor line abutting the second gate dielectric portion 15B are also covered by the photoresist 9. Other portions of the gate conductor lines 4 that need to be disconnected for SRAM circuit wiring are also exposed.

Compared with the first embodiment, two more openings are formed by patterning the photoresist 9. In a general semiconductor structure, the entirety of the portion of a gate conductor line located directly above a semiconductor fin portion is exposed to enable removal of the gate conductor line from above the semiconductor fin portion in a subsequent etch, while portions of the gate conductor line abutting gate dielectric portions located directly on sidewalls of the semiconductor fin portion are covered by the photoresist 9.

Figure 8A:
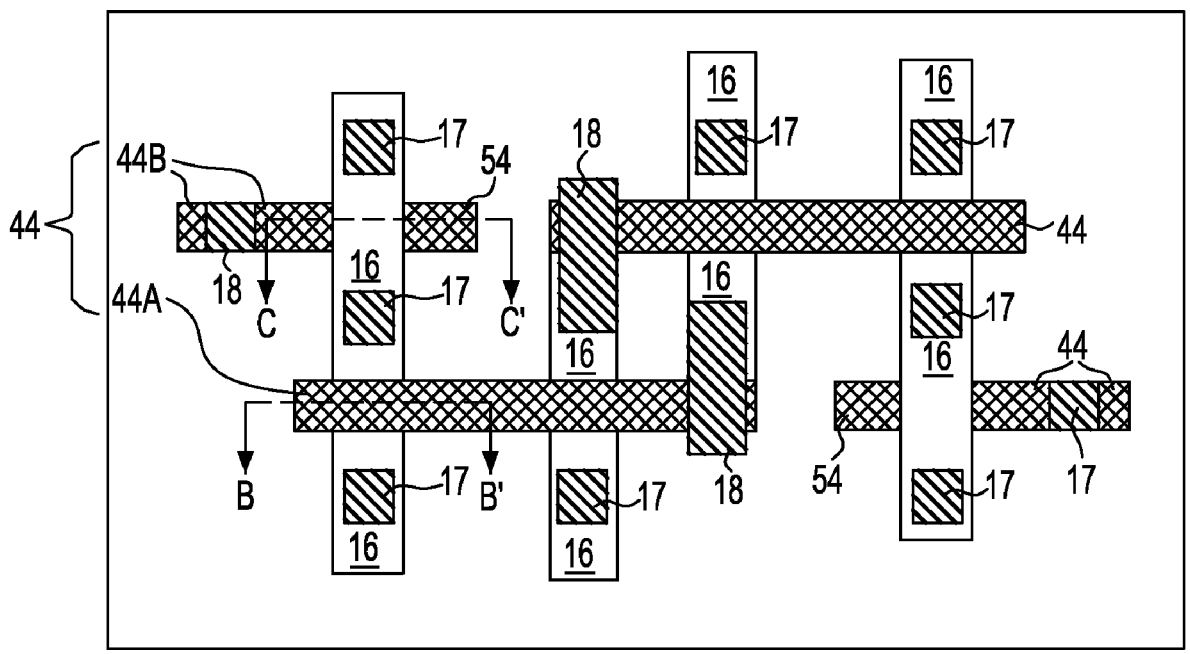
Figure 8B:
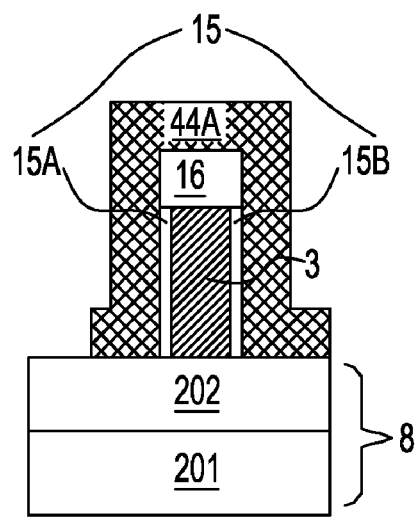
Figure 8C:
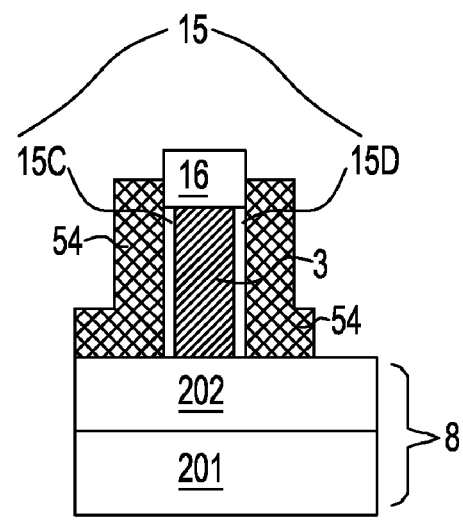

Referring to FIGS. 8A-8C, the exposed portions of the gate conductor lines 4 are etched by a reactive ion etch. The portion of the first gate conductor line located directly above the first semiconductor fin portion F1 is not removed by the reactive ion etch. The portion of the second gate conductor line located directly above the second semiconductor fin portion F2 is removed by the reactive ion etch, dividing the second gate conductor line into a second gate electrode 44B and a conductive block 54. In general, the remaining portions of the gate conductor lines 4 constitute gate electrodes 44 and conductive blocks 54. Of the multiple gate electrodes 44 formed at this step, the gate electrode 44 on the first semiconductor fin portion F1 is hereafter referred to as the first gate electrode 44A. The gate electrode 44 on the second semiconductor fin portion F2 is hereafter referred to as the second gate electrode 44B.

The gate electrodes 44 and the conductive blocks 54 comprise the same material. The difference between the gate electrodes 44 and the conductive blocks 54 is that the gate electrodes 44 are electrically connected other semiconductor components, a power supply, and/or ground, while the conductive blocks 54 are electrically floating, i.e., is not connected to any other semiconductor components, a power supply, or ground. The remaining portion of the photoresist 9 is removed after the reactive ion etch, for example, by ashing and the first exemplary semiconductor structure may be cleaned as necessary, for example, by a wet clean.

Standard semiconductor processing steps are performed, which are followed by formation of contact vias 17 and contact bars 18 as in the first embodiment. The second semiconductor structure comprises a dual gate finFET located on the first semiconductor fin portion F1 and a partially gated finFET located on the second semiconductor fin portion F2. The second gate electrode 44B abuts the third gate dielectric portion 15C and the conductive block 54 abuts the fourth gate dielectric portion 15D. The top surface of the fin cap 16 in the second semiconductor fin portion F2 does not abut a gate electrode.

Figure 9A:
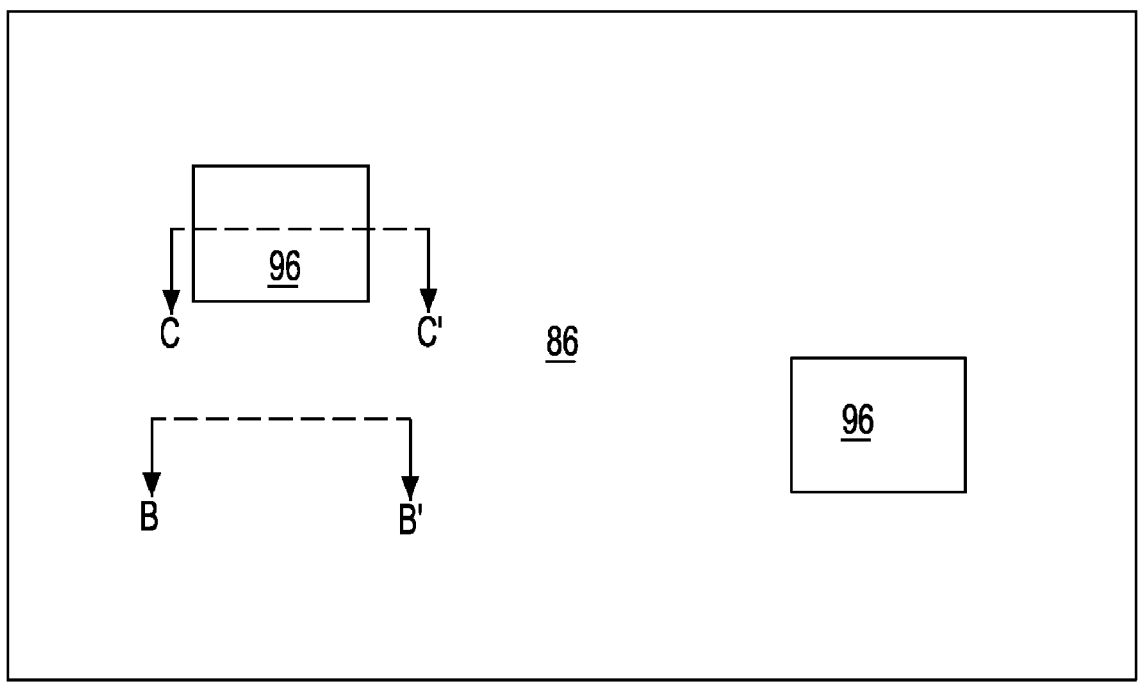
FIGS. 9A-12C are sequential views of a third exemplary SRAM structure employing inventive partially gated finFETs according to a third embodiment of the present invention. Figures with the suffix A are top-down views. Figures with the suffix B are cross-sectional views along the plane B-B' in the top down view with the same figure numeral and the suffix, A. Figures with the suffix C are cross-sectional views along the plane C-C' in the top down view with the same figure numeral and the suffix, A.
Figure 9B:
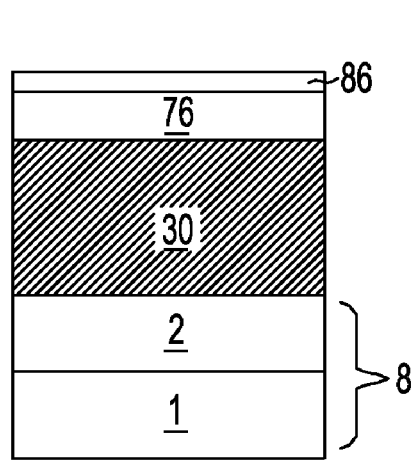
Figure 9C:
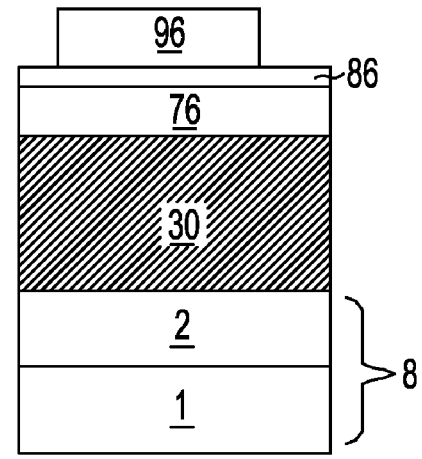

Referring to FIGS. 9A-9C, a third exemplary structure according to the present invention is shown, which comprises a semiconductor substrate 8 containing a handle substrate 1 and a buried insulator layer 2. A top semiconductor layer 30 is disposed on the buried insulator layer 2. The combination of the semiconductor substrate 8 and the top semiconductor layer 30 may be provided by a semiconductor-on-insulator substrate. A first fin cap layer 76 comprising a dielectric material such as a nitride or an oxide is formed on the top semiconductor layer 30. Further, at least another fin cap layer comprising another dielectric material is formed on the first fin cap layer 75. The at least another fin cap layer may comprise a stack of a second fin cap layer 86 and a third fin cap layer 96. The second fin cap layer 86 may comprise an oxide such as silicon oxide and may have a thickness from about 5 nm to about 30 nm. The third fin cap layer 96 may comprise a nitride such as silicon nitride, and may have a thickness from about 50 nm to about 200 nm.

The third fin cap layer 96 is lithographically patterned and etched so that the remaining portion of the third fin cap dielectric layer 96 covers the area of semiconductor fin portions on which formation of partially gated finFETs is desired. Specifically, the third fin cap layer 96 is removed from the area of for a first semiconductor fin portion to be subsequently formed. The third fin cap layer 96 is preserved in a portion of the area for a second semiconductor fin portion to be subsequently formed.

Figure 10A:
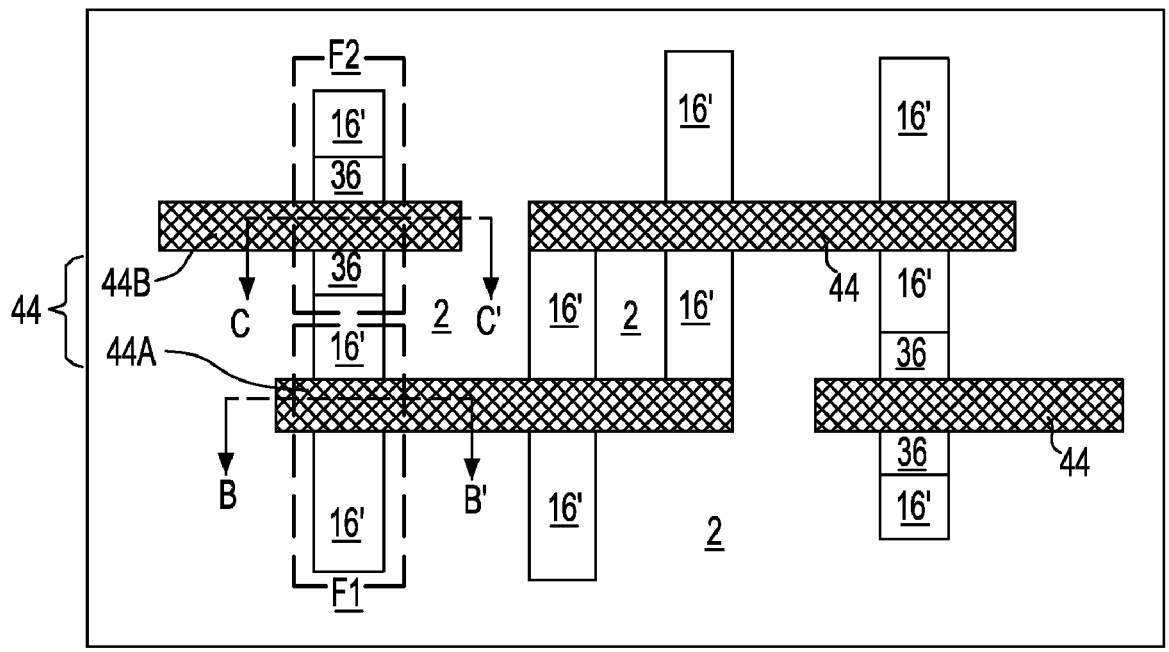
Figure 10B:
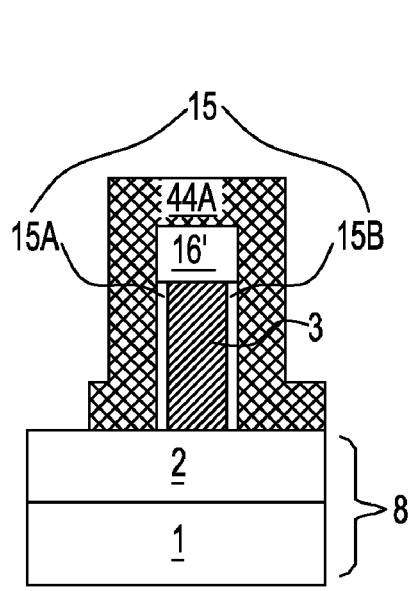
Figure 10C:
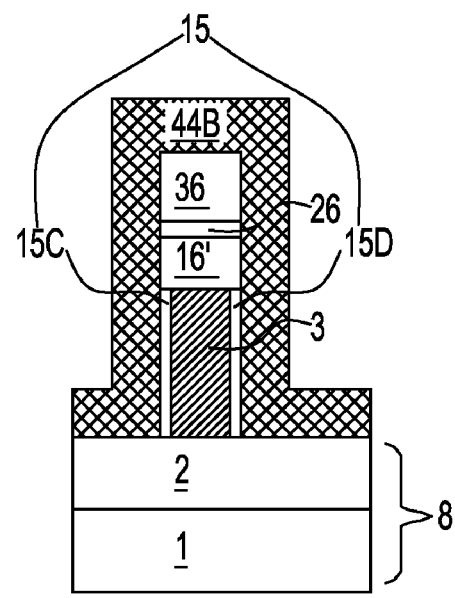

Referring to FIGS. 10A-10C, the stack of the top semiconductor layer 30, the first fin cap layer 76, the second fin cap layer 86, and optionally the third fin cap layer 96 is lithographically patterned and etched to form semiconductor fins 3, first fin caps 16', second fin caps 26, and third fin caps 36. Specifically, the remaining portions of the top semiconductor layer 30 after the etch constitutes the semiconductor fins 3. The remaining portions of the first fin cap layer 76 constitute the first fin caps 16'. The remaining portions of the second fin cap layer 86 constitute the second fin caps 26. The remaining portions of the third fin cap layer 96 constitute the third fin caps 36.

The composition and structure of the semiconductor fins 3 are the same as in the first embodiment of the present invention. In the description of the present invention, two portions of the semiconductor fins 3 are specifically referred to as a first semiconductor fin portion F1 and a second semiconductor fin portion F2, respectively, of which the areas are shown in dotted rectangles in FIG. 10A. In the third exemplary semiconductor structure, a dual gate n-type finFET is formed in the first semiconductor fin portion F1 and a partially gated n-type finFET is formed in the second semiconductor fin portion F2. The first semiconductor fin portion F1 and the second semiconductor fin portion F2 are located in the same semiconductor fin and abuts each other.

A gate dielectric 15 is formed on the semiconductor fins 3 as in the first embodiment. Of the many portions of the gate dielectric 15, the portion on a left sidewall, to be referred to as a first sidewall, of the first semiconductor fin portion F1 is hereafter referred to a first gate dielectric portion 15A. Likewise, the portion on a right sidewall, to be referred to as a second sidewall, of the first semiconductor fin portion F1 is hereafter referred to a second gate dielectric portion 15B. The portion on a left sidewall, to be referred to as a third sidewall, of the second semiconductor fin portion F2 is hereafter referred to a third gate dielectric portion 15C. The portion on a right sidewall, to be referred to as a fourth sidewall, of the second semiconductor fin portion F2 is hereafter referred to a fourth gate dielectric portion 15D.

A gate conductor layer (not shown) is formed on the surfaces of the first exemplary semiconductor structure and lithographically patterned and etched. The etched portions of the gate conductor layer forms gate electrodes 44, which may run in the direction perpendicular to at least one of the semiconductor fins 3. Specifically, one of the gate electrodes 44 runs over the first semiconductor fin portion F1 and another of the gate electrodes 44 runs over the second semiconductor fin portion F2. The gate electrode 44 over the first semiconductor fin portion F1 is hereafter referred to as a first gate electrode 44A, and the gate electrode 44 over the second semiconductor fin portion F2 is hereafter referred to as a second gate electrode 44B. Preferably, the first gate electrode 44A and the second gate electrode 44B have the same width to provide the same gate length to a dual gate n-type finFET to be formed on the first semiconductor fin portion F1 and to a partially gated n-type finFET to be formed on the second semiconductor fin portion F2. The gate electrodes 44 may comprise a semiconductor material such as doped silicon and/or metallic conductive material as may be employed in metal gate structures.

A first fin cap 16' is present between the first semiconductor fin portion F1 and the first gate electrode 44A. However, a first fin cap 16', a second fin cap 26, and a third fin cap 36 are present between the second semiconductor fin portion F2 and the second gate electrode 44B. In general, at least another fin cap is present above a first fin cap 16' and a gate electrode in the region in which a partially gated finFET is to be formed.

In the description of the third embodiment, the gate electrodes 44 are formed directly from a gate conductor layer 30 without forming gate conductor lines as in the first or second embodiments. However, formation of the gate electrodes 44 through intermediate structures such as gate conductor lines as were employed in the first and second embodiments may be done, and is explicitly contemplated herein.

Standard semiconductor processing steps follow such as extension implantations, formation of gate spacers, source and drain implantation, source and drain activation anneals, silicide formation, and optional formation of stress-generating structures such as stress-generating embedded regions and/or stress generating liners. The various processing steps may be performed to form a six finFET SRAM cell having a circuit configuration in FIG. 2.

Figure 11A:
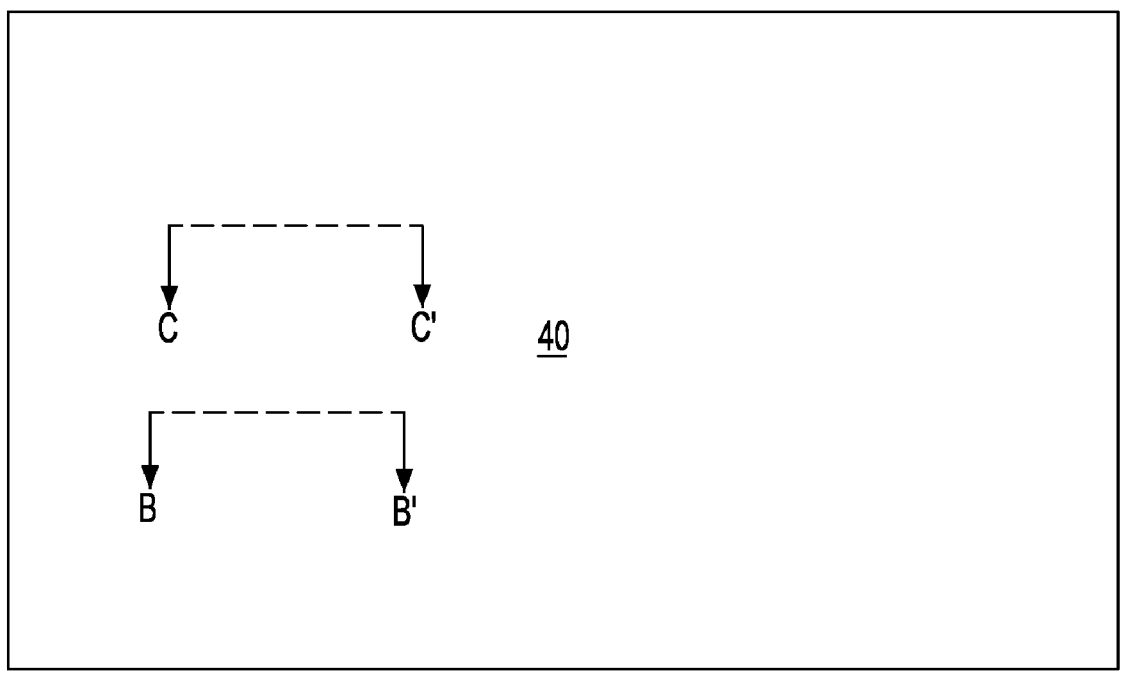
Figure 11B:
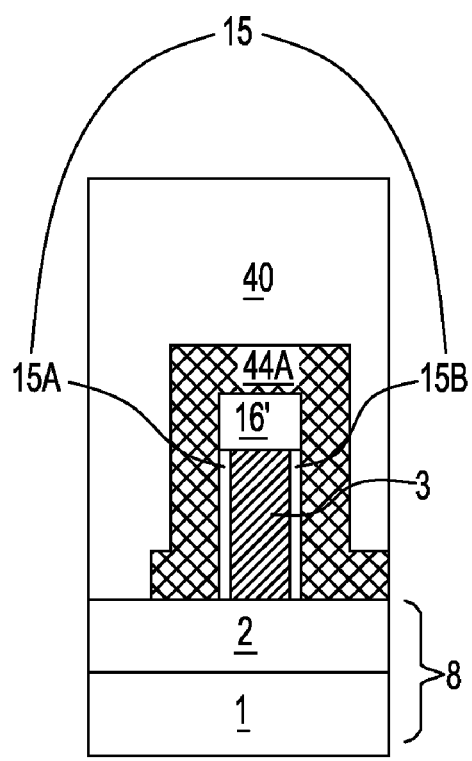
Figure 11C:
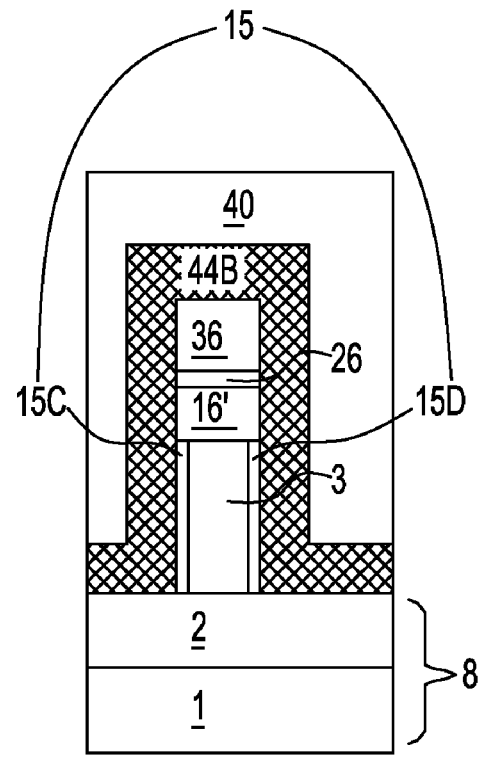

Referring to FIGS. 11A-11C, a middle-of-line (MOL) dielectric 40 is deposited over the surfaces of the third exemplary structure. The same material may be employed for the MOL dielectric 40 as in the first embodiment. The thickness of the MOL dielectric 40 is at least equal to the combined heights of the second semiconductor fin portion F2, the stack of various fin caps (16', 26, 36) over the second semiconductor fin portion F2, and the portion of the second gate electrode 44B above the stack of various fin caps (16', 26, 36).

Figure 12A:
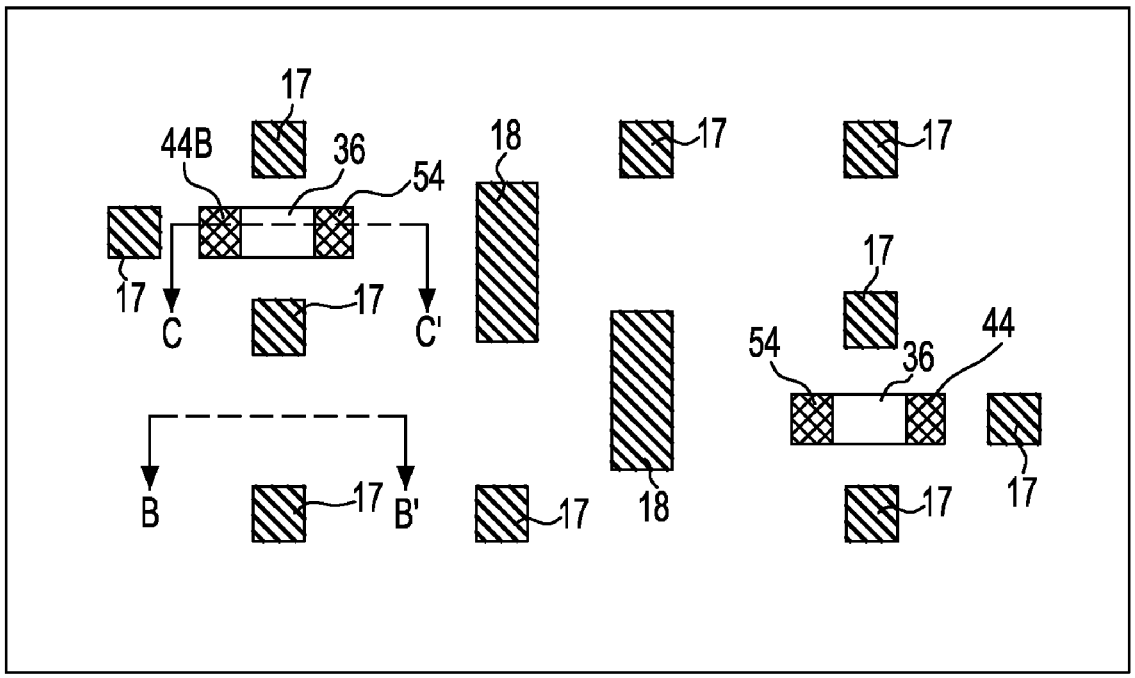
Figure 12B:
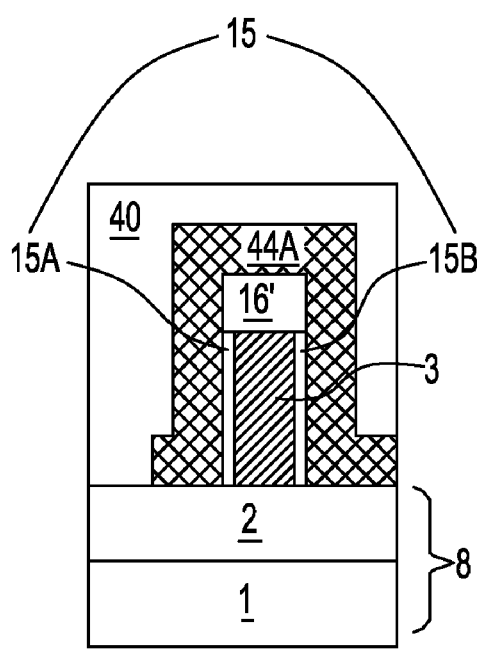
Figure 12C:
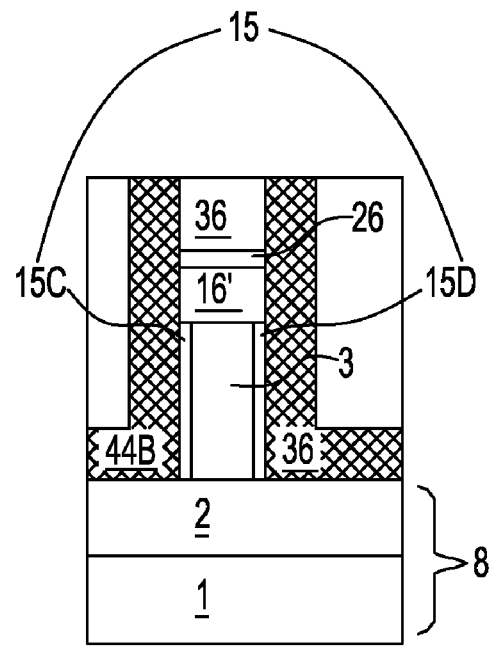

Referring to FIGS. 12A-12C, the MOL dielectric 40 is planarized at least down to a top surface of the at least another fin cap, i.e., a top surface of the third fin caps 36. Preferably, the third fin caps 36 are employed as a stopping layer for the planarization process. The portions of the gate electrodes 44 located above a top surface of the at least another fin cap, i.e., the top surface of the third fin caps 36, are removed during the planarization process. Specifically, the second gate electrode 44B is divided into two portions, one of which is connected to another semiconductor device, a supply voltage, or ground and serves as a second gate electrode 44B after division. The other portion constitutes one of the conductive blocks 54, which is electrically floating, i.e., is not connected to any other semiconductor components, a power supply, or ground. In general, a conductive block 54 is formed on the opposite side of a gate electrode 44 that contacts only one side of a semiconductor fin 3 in each of the partially gated finFETs.

Contact via holes and/or contact bar holes are formed in the MOL dielectric 40 and filled with metal to from contact vias 17 and contact bars 18. The third semiconductor structure comprises a dual gate finFET located on the first semiconductor fin portion F1 and a partially gated finFET located on the second semiconductor fin portion F2. The first gate electrode 44A abuts a top surface and two sidewalls of the first gate cap 16', the first gate dielectric portion 15A, and the second gate dielectric portion 15B. The second gate electrode 44B abuts the third gate dielectric portion 15C but does not abut the fourth gate dielectric portion 15D or the fourth sidewall of the second semiconductor fin portion. One of the conductive blocks 54 abuts the fourth gate dielectric portion 15D. A set of sidewall surfaces of the first, second, and third fin caps (16', 26, 36) located on one side of second the semiconductor fin portion F2 abuts the second gate electrode 44B. Another set of sidewall surfaces of the first, second, and third fin caps (16', 26, 36) located on the other side of second the semiconductor fin portion F2 abuts the conductive block 54. Exposed portions of the gate electrode 44 and the conductive blocks 54 on the surface of the MOL dielectric 40 may be recessed as needed. It is noted that only gate electrodes 44 forming partially gated finFETs are exposed on the surface the MOL dielectric layer 40.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising:
  a semiconductor fin located on a substrate, said semiconductor fin having a first sidewall and a second sidewall, wherein said second sidewall is opposite said first sidewall, and wherein said semiconductor fin is fully depleted upon operation;
  a gate dielectric portion located on said first sidewall of said semiconductor fin;

a gate electrode located on a first side of said semiconductor fin, said gate electrode laterally abutting said gate dielectric portion located on said first sidewall, wherein no gate electrode is present on a second side of said semiconductor fin that is opposite said first side of said semiconductor fin and wherein no gate dielectric portion is located on said second sidewall of the semiconductor fin; and a middle-of-the line (MOL) dielectric surrounding the semiconductor fin wherein a portion of the MOL dielectric is in direct contact with a bare surface of said second sidewall of said semiconductor fin.

2. The semiconductor structure of claim 1, further comprising a fin cap comprising a dielectric material and having a first fin cap sidewall and a second fin cap sidewall, wherein said first fin cap sidewall abuts said gate electrode and said second fin cap sidewall does not abut said gate electrode.

3. A semiconductor structure comprising:
a dual gate finFET containing:
   a first semiconductor fin portion located on a substrate;
   a first gate dielectric portion located on a first sidewall of said first semiconductor fin portion;
   a second gate dielectric portion located on a second sidewall of said first semiconductor fin portion, wherein said second sidewall is located on the opposite side of said first sidewall; and
   a first gate electrode laterally abutting said first gate dielectric portion and said second gate dielectric portion; and
a partially gated finFET containing:
   a second semiconductor fin portion having a third sidewall and a fourth sidewall located on said substrate, wherein said fourth sidewall is opposite said third sidewall;
   a third gate dielectric portion located on the third sidewall of said second semiconductor fin portion;
   a second gate electrode located on a first side of said semiconductor fin portion, said second gate electrode laterally abutting said third gate dielectric portion located on said third sidewall, wherein no gate electrode is present on a second side of said second semiconductor fin portion that is opposite said first side of said second semiconductor fin portion, and no gate dielectric portion is located on said fourth sidewall of the semiconductor fin, and wherein first and second semiconductor fin portions are fully depleted upon operation; and
   a middle-of-the line (MOL) dielectric surrounding the first and second semiconductor fins wherein a portion of the MOL dielectric is in direct contact with a bare surface of said fourth sidewall of said second semiconductor fin.

4. The semiconductor structure of claim 3, wherein said first semiconductor fin portion and said second semiconductor fin portion are located in the same semiconductor fin.

5. The semiconductor structure of claim 4, wherein said dual gate finFET is a pull-down n-type finFET and said partially gated finFET is a pass gate n-type finFET.

6. The semiconductor structure of claim 3, further comprising:
a fin cap comprising a first dielectric material and located above and vertically abutting said first semiconductor fin portion and said second semiconductor fin portion; and
at least another fin cap comprising a second dielectric material and vertically abutting said fin cap above said first semiconductor fin portion and not present above said second semiconductor fin portion.

* * * * *